United States Patent
Barson et al.

(10) Patent No.: US 6,989,991 B2
(45) Date of Patent: Jan. 24, 2006

(54) THERMAL MANAGEMENT SYSTEM AND METHOD FOR ELECTRONIC EQUIPMENT MOUNTED ON COLDPLATES

(75) Inventors: George F. Barson, Plano, TX (US); Richard M. Weber, Prosper, TX (US); James L. Haws, McKinney, TX (US)

(73) Assignee: Raytheon Company, Waltham, MA (US)

( * ) Notice: Subject to any disclaimer, the term of this patent is extended or adjusted under 35 U.S.C. 154(b) by 14 days.

(21) Appl. No.: 10/848,336

(22) Filed: May 18, 2004

(65) Prior Publication Data

US 2005/0259396 A1 Nov. 24, 2005

(51) Int. Cl.
*H05K 7/20* (2006.01)
(52) U.S. Cl. .............. 361/699; 361/711; 257/712; 257/714; 174/15.1; 165/80.4
(58) Field of Classification Search .......... 361/689, 361/698, 699, 704, 709, 711; 165/80.3, 80.4, 165/104.33; 257/712–714; 174/15.1
See application file for complete search history.

(56) References Cited

U.S. PATENT DOCUMENTS

| | | | | |
|---|---|---|---|---|
| 5,453,911 A | * | 9/1995 | Wolgemuth et al. | 361/689 |
| 5,978,220 A | * | 11/1999 | Frey et al. | 361/699 |
| 6,016,007 A | * | 1/2000 | Sanger et al. | 257/714 |
| 6,184,832 B1 | | 2/2001 | Geyh et al. | 343/700 |
| 6,297,775 B1 | | 10/2001 | Haws et al. | 343/700 |
| 6,578,626 B1 | * | 6/2003 | Calaman et al. | 165/80.4 |
| 6,588,647 B2 | * | 7/2003 | Yamada et al. | 228/112.1 |
| 6,591,898 B1 | * | 7/2003 | Chu et al. | 165/80.4 |
| 6,679,315 B2 | * | 1/2004 | Cosley et al. | 165/80.4 |
| 6,819,561 B2 | * | 11/2004 | Hartzell et al. | 361/689 |
| 6,863,119 B2 | * | 3/2005 | Sugito et al. | 165/104.33 |

OTHER PUBLICATIONS

John Patrick O'Connor, "*Reducing Surface Temperature Gradients by Tailoring Convective Film Coeficients*", Advancing Microelectronics, vol. 28, No. 2, Mar./Apr. 2001 (http://www.imaps.org/adv_micro/2001mar_apr/2.html).

* cited by examiner

*Primary Examiner*—Boris Chérvinsky
(74) *Attorney, Agent, or Firm*—Baker Botts L.L.P.

(57) ABSTRACT

According to an embodiment of the present invention, a thermal management system for electronic components includes a plastic coldplate having a mounting surface for mounting one or more electronic components, one or more passageways configured to have a fluid flow therethrough disposed within the plastic coldplate, and a highly conductive material disposed within the plastic coldplate and thermally coupled to the mounting surface. The highly conductive material is operable to transfer heat from the mounting surface to the fluid flow.

17 Claims, 9 Drawing Sheets

THERMAL MANAGEMENT SYSTEM AND METHOD FOR ELECTRONIC EQUIPMENT MOUNTED ON COLDPLATES

TECHNICAL FIELD OF THE INVENTION

This invention relates in general to thermal management of electronic equipment and, more particularly, to a thermal management system and method for electronic equipment mounted on coldplates.

BACKGROUND OF THE INVENTION

A trend for electronic equipment is lighter weight and lower cost. Lighter weight electronic equipment is especially important for aerospace applications, such as Active Electronically Scanned Arrays ("AESAs"). These AESAs often have significant power dissipation due to the type of electronic components involved. To control the thermal gradients and temperature of these systems, liquid flows through the coldplates to which they are attached may be utilized. These liquid cooled coldplates are typically formed from aluminum, which is a major contributor to the system weight rollup but possesses good thermal conductivity.

SUMMARY OF THE INVENTION

According to an embodiment of the present invention, a thermal management system for electronic components includes a plastic coldplate having a mounting surface for mounting one or more electronic components, one or more passageways configured to have a fluid flow therethrough disposed within the plastic coldplate, and a highly conductive material disposed within the plastic coldplate and thermally coupled to the mounting surface. The highly conductive material is operable to transfer heat from the mounting surface to the fluid flow.

According to another embodiment of the present invention, a thermal management system for electronic components includes a highly conductive housing having a mounting surface for mounting one or more electronic components, a plastic coldplate disposed within the highly conductive housing, and a highly conductive material disposed within the plastic coldplate and thermally coupled to the mounting surface. The highly conductive material is operable to spread the heat throughout a volume of the plastic coldplate.

Embodiments of the invention provide a number of technical advantages. Embodiments of the invention may include all, some, or none of these advantages. For example, in one embodiment, forming coldplates of plastic materials enhances thermal performance, reduces weight, and lowers cost of high power phased array systems. Different techniques are utilized to efficiently move heat from the surface of a plastic coldplate into the cooling fluid. The techniques may be applicable to air, single phase liquid, and two phase (liquid/vapor) cooling. Some of the techniques of the present invention insert highly conductive material into the plastic coldplate to transfer the heat from the surface of the coldplate to the cooling liquid. Other may involve methods of efficiently transferring the heat into the cooling liquid itself.

Other technical advantages are readily apparent to one skilled in the art from the following figures, descriptions, and claims.

DETAILED DESCRIPTION OF THE INVENTION

Embodiments of the present invention and some of their advantages are best understood by referring to FIGS. 1 through 3B of the drawings, like numerals being used for like and corresponding parts of the various drawings.

Figure 1:
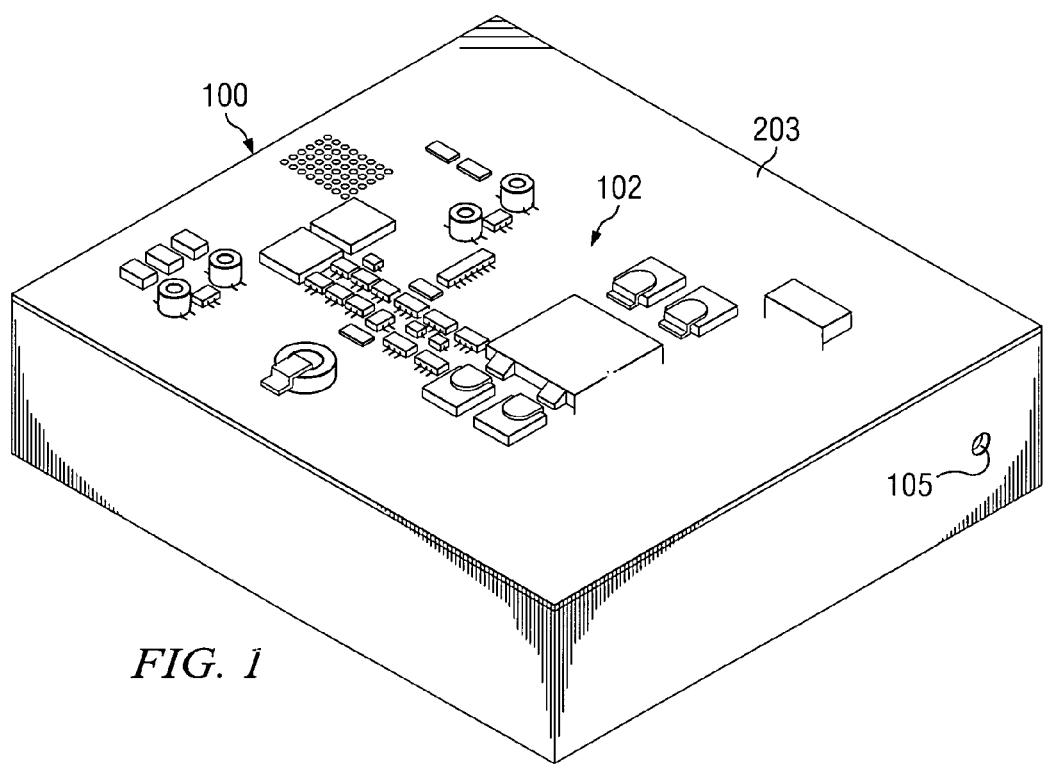
FIG. 1 is a perspective view of a plurality of electronic components mounted on a coldplate in accordance with an embodiment of the invention.

FIG. 1 is a perspective view of a plurality of electronic components 102 mounted on a coldplate 100 in accordance with one embodiment of the present invention. Any suitable method of coupling electronic components 102 to coldplate 100 is contemplated by the present invention. In the illustrated embodiment, electronic components 102 are mounted on a circuit board 203 that is mounted on coldplate 100; however, the present invention contemplates electronic components 102 being directly mounted to coldplate 100. In the illustrated embodiment, electronic components 102 comprise a high-powered phased array antenna system; however, electronic components 102 may comprise any suitable active electronically scanned array ("AESA") or other suitable electronic systems having any suitable function.

Coldplate 100 may be any suitable substrate for mounting electronic components 102. One of the functions of coldplate 100 is to control thermal gradients and temperatures of electronic components 102 in order to ensure proper functioning of electronic components 102. Electronic components 102 sometimes have significant power dissipation, especially for phased array and other types of antenna systems. To control the thermal gradients and temperature of electronic components 102, a cooling fluid may be circulated into coldplate 100 via an inlet 105. Any suitable fluid is contemplated by the present invention, such as ethylene glycol mixed with water or polyalphaolefin ("PAO") or other suitable fluid.

Because antenna systems, such as the one illustrated in FIG. 1, are oftentimes utilized in aerospace applications, such as military aircraft, low weight is often a desired criteria along with low cost of manufacture. However, because of the thermal considerations, the type of material a particular coldplate is formed from is important with respect to thermal conductivity.

Therefore, according to the teachings of one embodiment of the present invention, coldplate 100 is formed from plastic in order to keep weight down. Any suitable polymer may be utilized for coldplate 100 and the subsequent coldplates illustrated in FIGS. 2A through 3B. As described in greater detail below in conjunction with FIGS. 2A through 3B, a highly conductive material or materials are sometimes utilized along with a plastic coldplate to enhance the thermal management of electronic components 102. A highly conductive material as used herein is a material having a thermal conductivity of at least 5.0 W/m*K. For example, a highly conductive material may be graphite, aluminum, or other suitable highly conductive material. Various embodiments of thermal management systems using a plastic coldplate are shown and described below in conjunction with FIGS. 2A through 3B.

FIGS. 2A through 2F are various views of a thermal management system for electronic components 102 utilizing a plastic coldplate according to various embodiments of the present invention. Generally, the embodiments illustrated in FIGS. 2A through 2F insert highly conductive material into plastic coldplates to facilitate the efficient transferring of heat from a surface of the coldplate to a cooling liquid.

Figures 1, 2A:
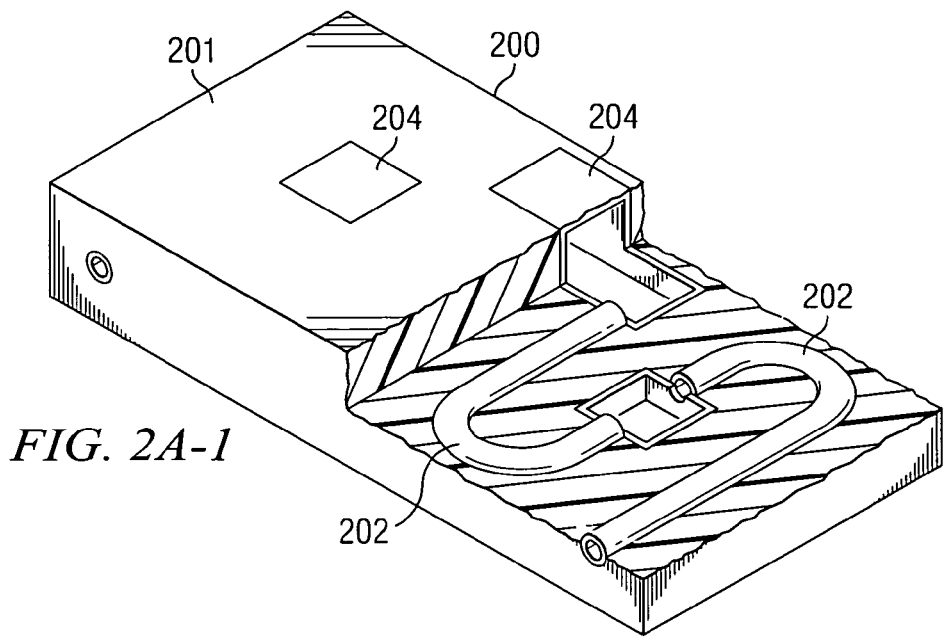
FIGS. 2A through 2F are various views of a thermal management system for the coldplate of FIG. 1 according to some embodiments of the present invention.
Figures 2, 2A:
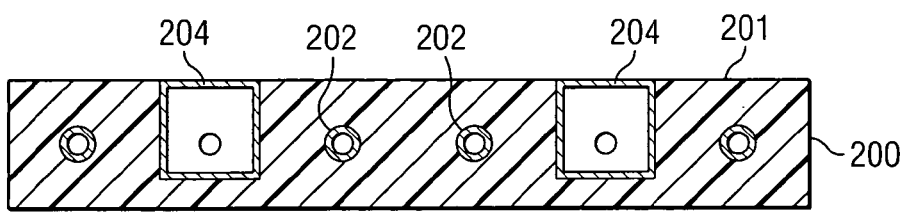
Figures 2, 2A, 3:
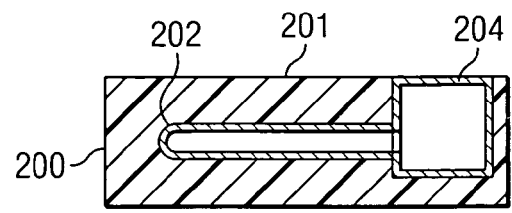

Referring to FIG. 2A, a plastic coldplate 200 includes one or more tubes 202 coupled to one or more enclosures 204. Coldplate 200 may be any suitable size and shape and may be formed using any suitable manufacturing method. Coldplate 200 has a mounting surface 201 for mounting electronic components thereto. Tubes 202 may also have any suitable size and shape and may be formed within coldplate 200 using any suitable method. In a particular embodiment, tubes 202 are arranged within coldplate 200 in a boustrophedonic manner; however, any suitable configuration of tubes 202 are contemplated by the present invention. Tubes 202 are formed from a suitable highly conductive material, such as graphite or aluminum.

Enclosures 204 may have any suitable size and shape and are also formed from any suitable highly conductive material. In a particular embodiment, enclosures 204 are expanded portions of tube 202. Enclosures 204 have at least a portion that coincides with mounting surface 201 of coldplate 200. Enclosures 204 are positioned such that they correspond to respective portions of mounting surface 201 that have the highest heat-emitting electronic components thereon. Thus, a fluid flowing through tubes 202 and enclosures 204 may efficiently receive the heat generated by these high heat-emitting electronic components to control the thermal gradients within coldplate 200.

Figures 1, 2B:
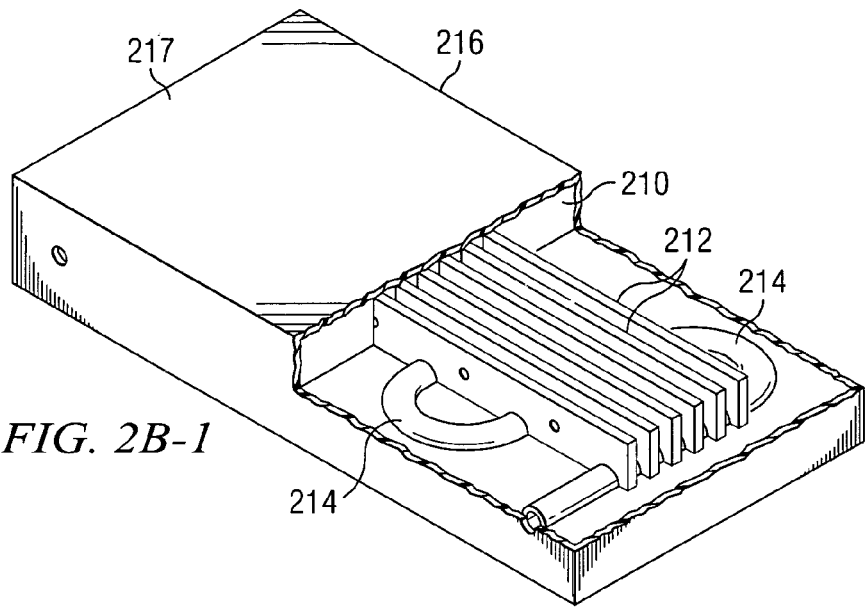
Figures 2, 2B:
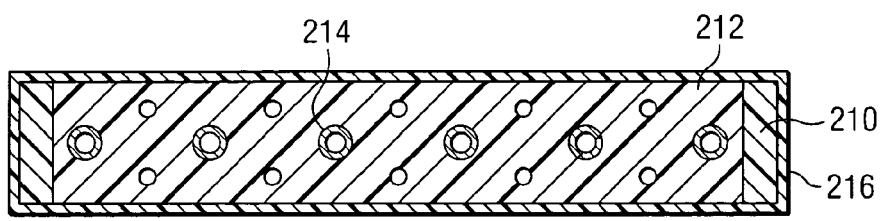
Figures 2, 2B, 3:
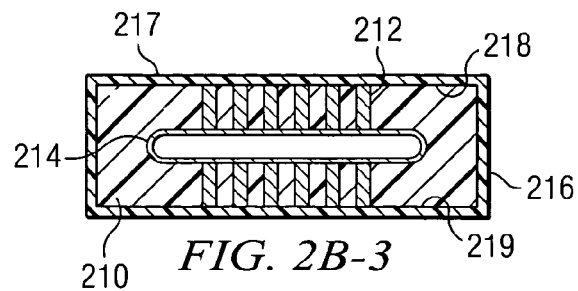

Referring to FIG. 2B, a plastic coldplate 210 includes one or more tubes 214 coupled to a plurality of fins 212. Coldplate 210 is also housed within a housing 216 having a mounting surface 217 for mounting electronic components thereto. Coldplate 210 may be any suitable size and shape and may be formed using any suitable manufacturing method. Tubes 214 may also be any suitable size and shape and may be formed within coldplate 210 using any suitable manufacturing method. In a particular embodiment, tubes 214 are arranged in a boustrophedonic manner; however, tubes 214 may be arranged within coldplate 210 in any suitable manner. Tubes 214 are formed from a suitable highly conductive material, such as graphite or aluminum.

Fins 212 may be any suitable size and shape and are also formed from any suitable highly conductive material. Fins 212 may couple to tubes 214 in any suitable manner. In the illustrated embodiment, fins 212 are arranged vertically and parallel to one another; however, fins 212 may have any suitable arrangement. In one embodiment, fins 212 contact an upper inside surface 218 and a lower inside surface 219 of housing 216 in order to efficiently transfer the heat generated by electronic components on mounting surface 217 to a cooling liquid flowing through tubes 214 during operation. In other embodiments, fins 212 do not contact inside surface 218 and/or inside surface 219 of housing 216.

Housing 216 may be any suitable size and shape and may be formed from any suitable highly conductive material. In one embodiment, housing 216 generally conforms to the outside configuration of coldplate 210.

Figures 1, 2C:
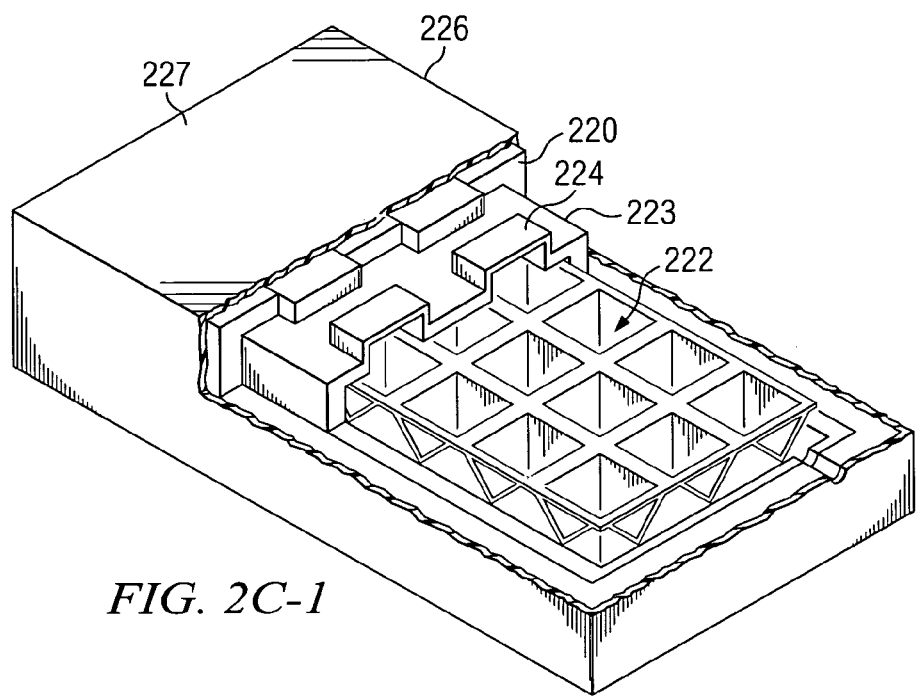
Figures 2, 2C:
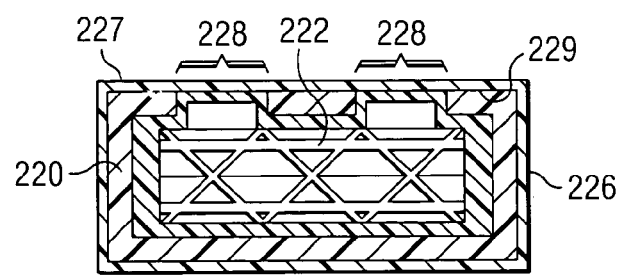

Referring to FIG. 2C, a waffle panel 222 is disposed within an inner housing 223 and then disposed within a plastic coldplate 220. Coldplate 220 is, in turn, disposed within an outer housing 226 having a mounting surface 227 for mounting electronic components thereon.

Waffle panel 222 and inner housing 223 may be of any suitable shape and may be formed from any suitable highly conductive material. Any suitable manufacturing method may be utilized to manufacture waffle panel 222 and inner housing 223. In one embodiment, inner housing 223 includes a plurality of projections 224 that couple to an inside surface 229 of outer housing 226 in order to efficiently transfer heat from mounting surface 227 down into inner housing 223 in order to contact fluid flowing through waffle panel 222 during operation. In one embodiment, projections 224 are positioned such that they correspond to respective portions 228 of mounting surface 227 that have the highest heat-emitting electronic components thereon.

Coldplate 220 may have any suitable size and shape and may be formed using any suitable manufacturing method. Outer housing 226 may also have any suitable size and shape and generally conforms to the outside configuration of coldplate 220. Outer housing 226 may be formed from any suitable highly conductive material.

Figures 1, 2D:
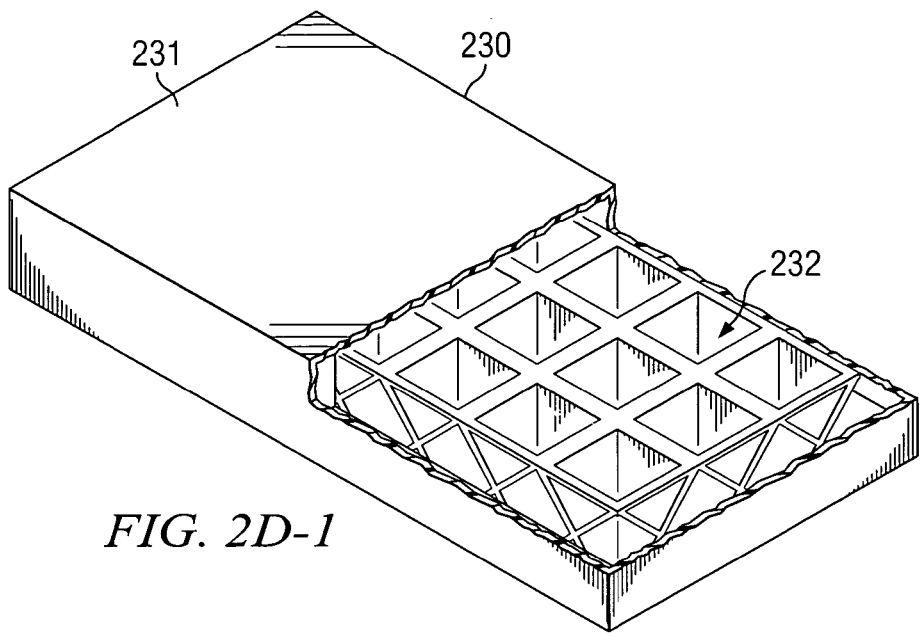
Figures 2, 2D:
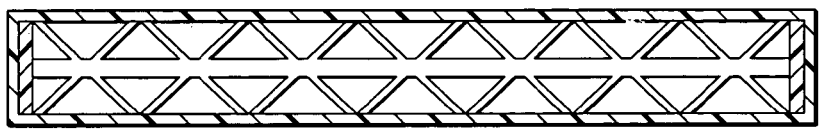
Figures 2, 2D, 3:
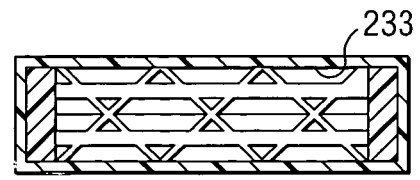

Referring to FIG. 2D, a plastic coldplate 230 includes a waffle panel 232 disposed therein. Waffle panel 232 is similar to waffle panel 222 of FIG. 2C and, hence, may be of any suitable shape and may be formed from any suitable highly conductive material using any suitable manufacturing method. In one embodiment, waffle panel 232 contacts an inside surface 233 of coldplate 230 in order to efficiently transfer heat from mounting surface 231 throughout the interior of coldplate 230. Waffle panel 232 may also contact the other inside surfaces of coldplate 230 in other embodiments of the invention.

Coldplate 230 may have any suitable size and shape and may be formed using any suitable manufacturing method. Coldplate 230 includes a mounting surface 231 for mounting electronic components thereto.

Figures 1, 2E:
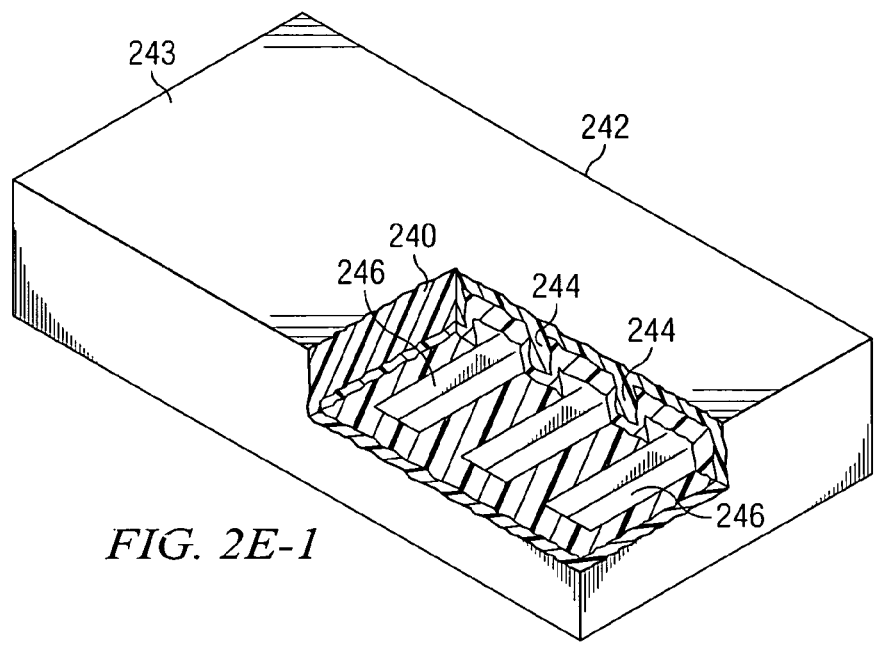
Figures 2, 2E:
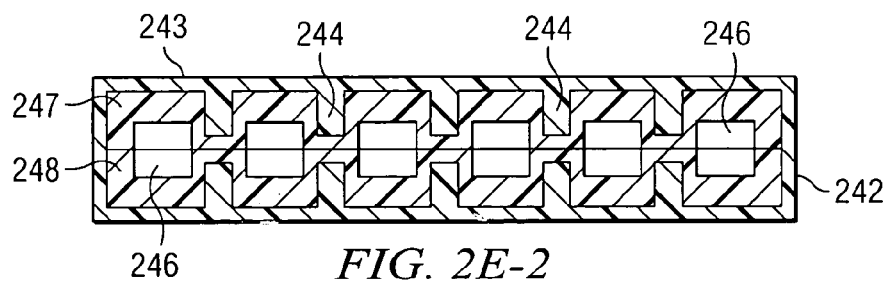
Figures 2, 2E, 3:
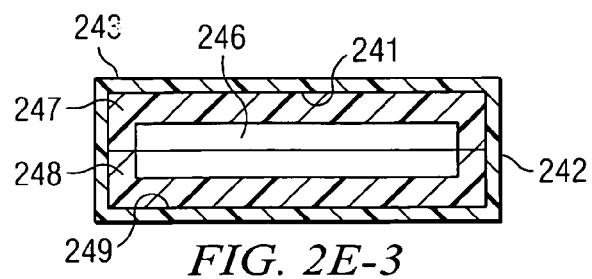

Referring to FIG. 2E, a plastic coldplate 240 includes a plurality of passageways 246 formed therein. Coldplate 240, in the illustrated embodiment, is disposed within a housing 242 having a mounting surface 243 for mounting electronic components thereto. Housing 242 may be formed from any suitable highly conductive material.

Coldplate 240 may have any suitable size and shape and may be formed using any suitable manufacturing method. In a particular embodiment, coldplate 240 is formed from a top half 247 and a bottom half 248 in order to facilitate passageways 246 being separate from one another. Separate flowpaths (not illustrated) may be associated with each passageway 246 for a cooling liquid.

Housing 242 may have a plurality of protrusions 244 extending from an upper inside surface 241 and a lower inside surface 249. Protrusions 244, in one embodiment, extend between adjacent passageways 246 in order to efficiently transfer heat from mounting surface 243 to a fluid flowing through each passageway 246. Protrusions 244 may have any suitable size and shape and may extend down into coldplate 240 any suitable distance. In other embodiments, protrusions 244 do not exist.

Figures 1, 2F:
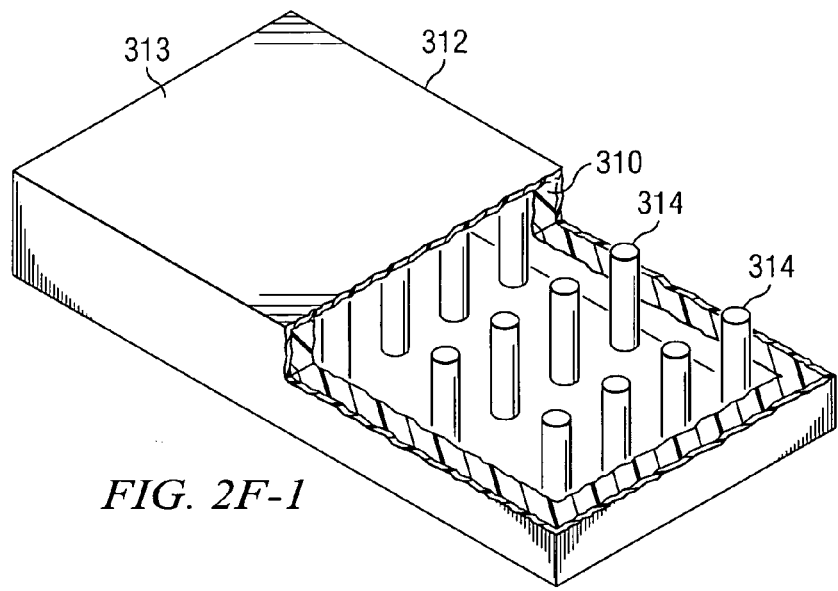
Figures 2, 2F:
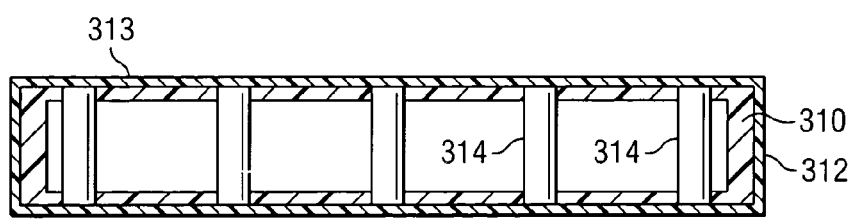
Figures 2, 2F, 3:
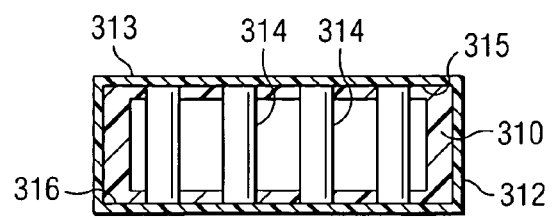

Referring to FIG. 2F, a plastic coldplate 310 includes a plurality of vertical posts 314 disposed therein. Coldplate 310 is also disposed within a housing 312 having a mounting surface 313 for mounting electronic components thereto. Housing 312 may have any suitable size and shape and may be formed from any suitable highly conductive material.

Coldplate 310 may be of any suitable size and shape and may be formed using any suitable manufacturing method. Vertical posts 314 may have any suitable size and shape and may be formed from any suitable highly conductive material. In the illustrated embodiment, vertical posts 314 couple to an upper inside surface 315 and a lower inside surface 316 of housing 312. In other embodiments, vertical posts 314 do not couple to upper inside surface 315 and/or lower inside surface 316. Vertical posts 314 may have any suitable arrangement and function to efficiently transfer heat emanating from electric components mounted on mounting surface 313 to a fluid flowing through coldplate 310.

Figures 1, 3A:
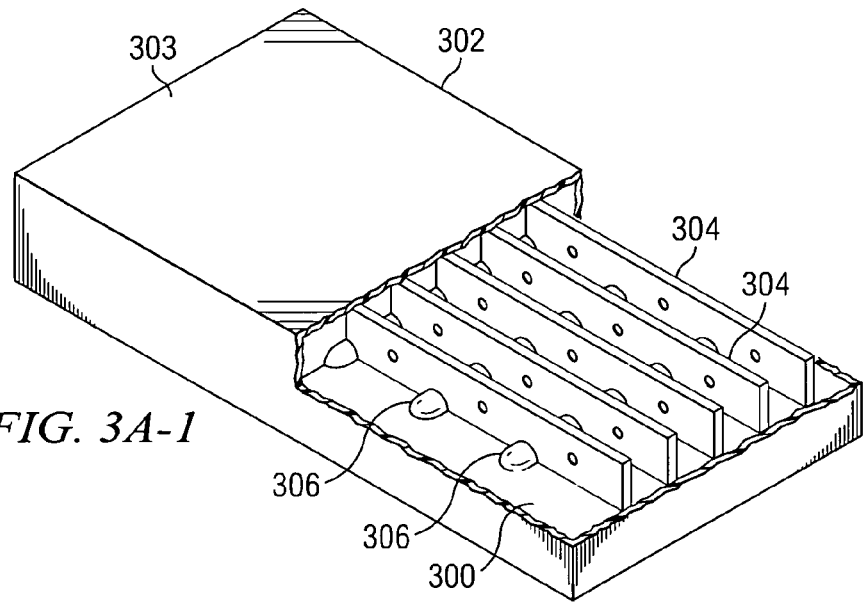
FIGS. 3A and 3B are various views of a thermal management system for the coldplate of FIG. 1 according to other embodiments of the present invention.
Figures 2, 3A:
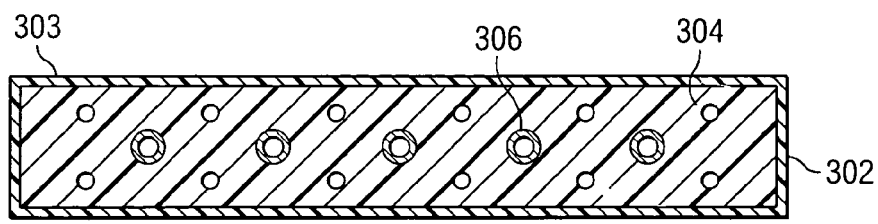
Figures 3, 3A:
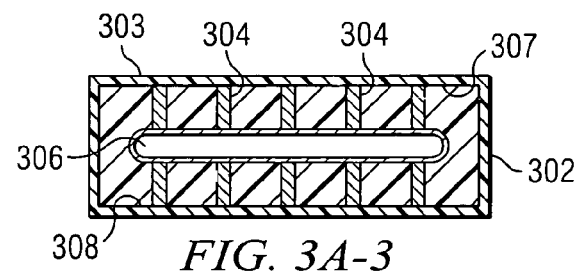
Figures 1, 3B:
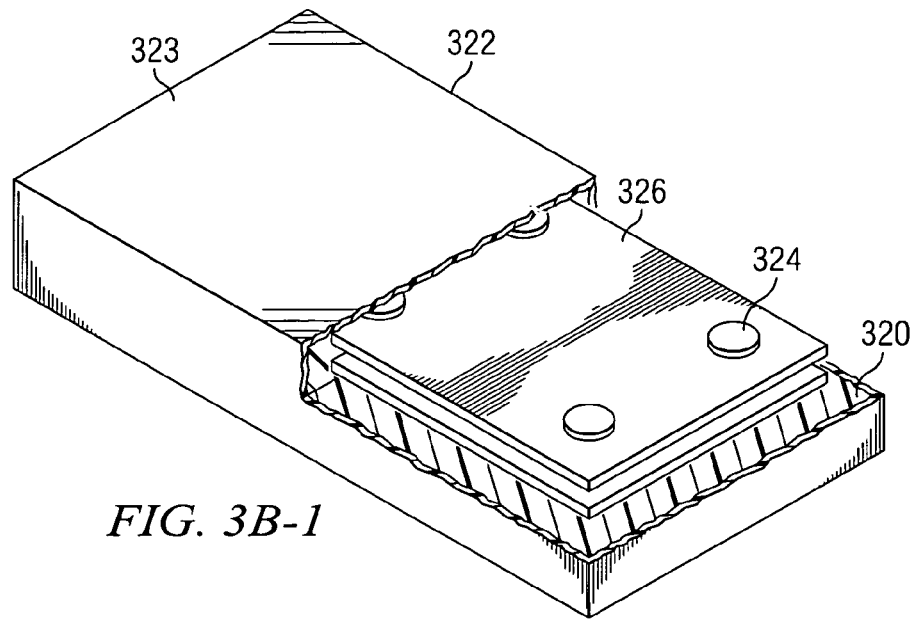
Figures 2, 3B:
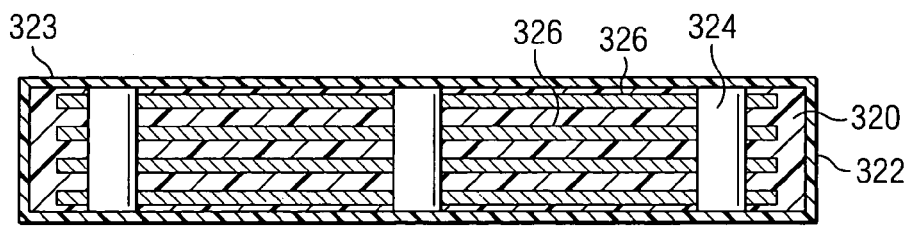
Figures 3, 3B:
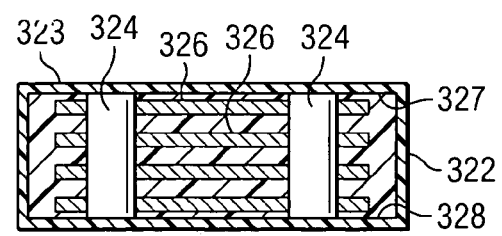

FIGS. 3A and 3B are various views of a thermal management system for electronic components 102 utilizing a plastic coldplate according to other embodiments of the present invention. The embodiments illustrated in FIGS. 3A and 3B may utilize highly conductive material to efficiently spread the heat from electronic components throughout a volume of the plastic coldplate.

Referring to FIG. 3A, a plastic coldplate 300 includes a plurality of fins 304 coupled to a plurality of heat pipes 306. Coldplate 300 is also disposed within a housing 302 having a mounting surface 303 for mounting electronic components thereto. Housing 302 may be any suitable size and shape and may be formed from any suitable highly conductive material.

Coldplate 300 may be of any suitable size and shape and may be formed using any suitable manufacturing method. Fins 304 and heat pipes 306 are formed from any suitable highly conductive material and may be disposed within coldplate 300 in any suitable manner. In the illustrated embodiment, fins 304 and heat pipes 306 form a grid-like structure; however, the present invention contemplates any suitable arrangement for fins 304 and heat pipes 306. Fins 304 are illustrated in FIG. 3A as being vertically disposed and parallel to one another; however, fins 304 may have other configurations. In the illustrated embodiment, fins 304 contact an upper inside surface 307 and a lower inside surface 308 of housing 302. In other embodiments, fins 304 do not directly couple to upper inside surface 307 and/or lower inside surface 308. Heat pipes 306 may be any suitable heat pipes having any suitable configuration.

Referring to FIG. 3B, a plastic coldplate 320 includes a plurality of vertical posts 324 and a plurality of horizontal fins 326. Coldplate 320 is also disposed within a housing 322 having a mounting surface 323 for mounting electronic components thereto. Housing 322 may have any suitable size and shape and may be formed from any suitable highly conductive material.

Coldplate 320 may have any suitable size and shape and may be formed using any suitable manufacturing method. Vertical posts 324 are similar to vertical posts 314 of FIG. 2F and, hence, vertical posts 324 may couple to one or the other (or both) of an upper inside surface 327 or a lower inside surface 328 of housing 322. Horizontal fins 326 couple to vertical posts 324 and may be any suitable size and shape and may be formed from any suitable highly conductive material. In the illustrated embodiment, horizontal fins 326 are parallel spaced apart fins that couple to each vertical post 324. However, horizontal fins 326 may have any suitable arrangement. Horizontal fins 326 help facilitate efficient spreading of heat throughout a volume of coldplate 320.

Thus, various embodiments of a thermal management system utilizing a plastic coldplate are illustrated in FIGS. 2A through 3B to efficiently control thermal gradients and temperatures within a particular coldplate. The plastic coldplates of the present invention help facilitate low weight and low cost for high-powered phased array antenna systems and other suitable electronic systems, which is especially important for aerospace applications. In addition, the thermal performance of plastic coldplates is enhanced by, in some embodiments, adding highly conductive material thereto as shown above in some of the embodiments in FIGS. 2A through 3B.

Although embodiments of the invention and some of their advantages are described in detail, a person skilled in the art could make various alterations, additions, and omissions without departing from the spirit and scope of the present invention as defined by the appended claims.

What is claimed is:

1. A thermal management system for electronic components, comprising:
   a plastic coldplate having a mounting surface for mounting one or more electronic components;
   one or more passageways disposed within the plastic coldplate, the passageways configured to have a fluid flow therethrough in such a manner that the fluid flow does not physically engage the plastic coldplate; and
   a highly conductive material disposed within the plastic coldplate and thermally coupled to the mounting surface, the highly conductive material operable to transfer heat from the mounting surface to the fluid flow.

2. The system of claim 1, wherein the electronic components comprise an Active Electronically Scanned Array.

3. The system of claim 1, further comprising a circuit board for mounting the one or more electronic components, the circuit board coupled to the mounting surface.

4. The system of claim 1, wherein the highly conductive material comprises a waffle panel.

5. The system of claim 4, wherein the waffle panel is disposed within a housing, the housing having one or more projections engaged with respective sections of the mounting surface.

6. The system of claim 1, wherein the plastic coldplate is formed from two separate pieces and the passageways are separated from one another.

7. The system of claim 6, wherein the highly conductive material comprises a plurality of protrusions extending between adjacent passageways.

8. The system of claim 1, wherein the one or more passageways comprises a tube disposed within the plastic coldplate in a boustrophedonic manner and wherein the highly conductive material comprises a plurality of fins coupled to the tube.

9. The system of claim 1, wherein the one or more passageways comprise one or more tubes disposed within the plastic coldplate and wherein the highly conductive material comprises one or more enclosures coupled to the tubes in series.

10. The system of claim 1, wherein the plastic coldplate is housed within a highly conductive housing, the mounting surface associated with the housing.

11. A thermal management method for electronic components, comprising:
    mounting one or more electronic components on a mounting surface of a plastic coldplate, the plastic coldplate having one or more passageways disposed therein that are configured to have a fluid flow therethrough in such a manner that the fluid flow does not physically engage the plastic coldplate;
    disposing a highly conductive material within the plastic coldplate; and
    thermally coupling the highly conductive material to the mounting surface to transfer heat from the mounting surface to the fluid flow during operation of the electronic components.

12. The method of claim 11, wherein the electronic components comprise an Active Electronically Scanned Array.

13. The method of claim 11, wherein mounting the one or more electronic components on the mounting surface of the plastic coldplate comprises mounting the one or more electronic components on a circuit board and mounting the circuit board to the mounting surface.

14. The method of claim 11, wherein thermally coupling the highly conductive material to the mounting surface comprises disposing a waffle panel within a housing and engaging one or more projections of the housing with respective portions of the mounting surface.

15. The method of claim 11, further comprising separating the passageways from one another.

16. The method of claim 11, wherein the one or more passageways comprises a tube disposed within the plastic coldplate in a boustrophedonic manner and wherein the highly conductive material comprises a plurality of fins coupled to the tube.

17. The method of claim 11, further comprising housing the plastic coldplate within a highly conductive housing, the mounting surface associated with the housing.

* * * * *